United States Patent
D'Alessio et al.

(10) Patent No.: US 10,389,376 B2
(45) Date of Patent: Aug. 20, 2019

(54) DIGITAL-TO-ANALOG CONVERTER CIRCUIT, CORRESPONDING DEVICE AND METHOD

(71) Applicant: STMicroelectronics S.r.l., Agrate Brianza (MB) (IT)

(72) Inventors: Luigino D'Alessio, Zelo Surrigone (IT); Germano Nicollini, Piacenza (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/020,678

(22) Filed: Jun. 27, 2018

(65) Prior Publication Data

US 2019/0013819 A1   Jan. 10, 2019

(30) Foreign Application Priority Data

Jul. 10, 2017 (IT) .......................... 102017000077220

(51) Int. Cl.
| | |
|---|---|
| *H03M 1/66* | (2006.01) |
| *H03M 1/46* | (2006.01) |
| *H03F 1/32* | (2006.01) |
| *H03F 3/00* | (2006.01) |
| *H03F 3/45* | (2006.01) |

(52) U.S. Cl.
CPC .......... *H03M 1/466* (2013.01); *H03F 1/3211* (2013.01); *H03F 3/005* (2013.01); *H03F 3/45475* (2013.01); *H03M 1/468* (2013.01); *H03F 2200/156* (2013.01); *H03F 2200/159* (2013.01); *H03F 2200/264* (2013.01); *H03F 2203/45134* (2013.01); *H03F 2203/45136* (2013.01); *H03F 2203/45171* (2013.01); *H03F 2203/45514* (2013.01); *H03F 2203/45534* (2013.01); *H03F 2203/45546* (2013.01); *H03F 2203/45551* (2013.01)

(58) Field of Classification Search
CPC .............................. G03M 1/466; H03M 1/468
USPC .................................................. 341/144, 150
See application file for complete search history.

(56) References Cited

U.S. PATENT DOCUMENTS

| | | | | |
|---|---|---|---|---|
| 5,459,464 A | * | 10/1995 | Beneteau | G01R 21/133 341/143 |
| 6,194,946 B1 | | 2/2001 | Fowers | |
| 6,556,072 B1 | | 4/2003 | Nicollini et al. | |
| 6,952,176 B2 | * | 10/2005 | Frith | H03M 3/322 341/143 |
| 2002/0167353 A1 | * | 11/2002 | Segawa | H03H 19/004 327/554 |

* cited by examiner

*Primary Examiner* — Peguy Jean Pierre
(74) *Attorney, Agent, or Firm* — Slater Matsil, LLP

(57) ABSTRACT

In some embodiments, a circuit for use in devices involving digital-to-analog conversion of signals includes: a capacitive digital-to-analog converter array and an amplifier. The capacitive digital-to-analog converter includes an input port for receiving a digital input signal and an output port. The amplifier includes capacitive feedback loops that include a first capacitor coupling the output of the amplifier with the input of the amplifier and a second capacitor coupled to the output port of the digital-to-analog converter array at the input of the amplifier. The circuit further includes a set of switches that include a first switch and a second switch coupled with opposed ends of the second capacitor at the input and at the output of the amplifier, respectively.

20 Claims, 5 Drawing Sheets

US 10,389,376 B2

DIGITAL-TO-ANALOG CONVERTER CIRCUIT, CORRESPONDING DEVICE AND METHOD

CROSS-REFERENCE TO RELATED APPLICATIONS

This application claims priority to Italian Patent Application No. 102017000077220, filed on Jul. 10, 2017, which application is hereby incorporated herein by reference.

TECHNICAL FIELD

This disclosure relates generally to electronic circuits, and, in particular embodiments, to a digital-to-analog converter circuit, corresponding device, and method.

BACKGROUND

Analog-to-digital converters (ADCs) and digital-to-analog converters (DACs) may be implemented using, e.g., resistors, current generators or capacitors.

Arrangements including capacitors may represent an option if high linearity (e.g., a number of bits in excess of 13) is desirable and/or if avoiding calibration is held to be advantageous, e.g., in order to save time and reduce cost associated with testing, or for other reasons, e.g., because calibration can be difficult in some cases.

SUMMARY

One or more embodiments relate to digital-to-analog conversion of signals.

One or more embodiments may be used in a wide variety of applications. For example, data converters for use, e.g., in hard disks, smartphones, tablets, and other various types of devices, such as mobile/portable and stationary devices. Possible applications include applications in the area of audio and/or video processing.

One or more embodiments achieve improved Integral Non-Linearity (INL) performance.

One or more embodiments may relate to a corresponding device as well as to a corresponding method.

One or more embodiments may offer one or more of the following advantages: a simple implementation of the converter clocking scheme, e.g., using only few extra logic gates and transistors, negligible area increase in comparison with conventional solutions, and no appreciable additional power consumption.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
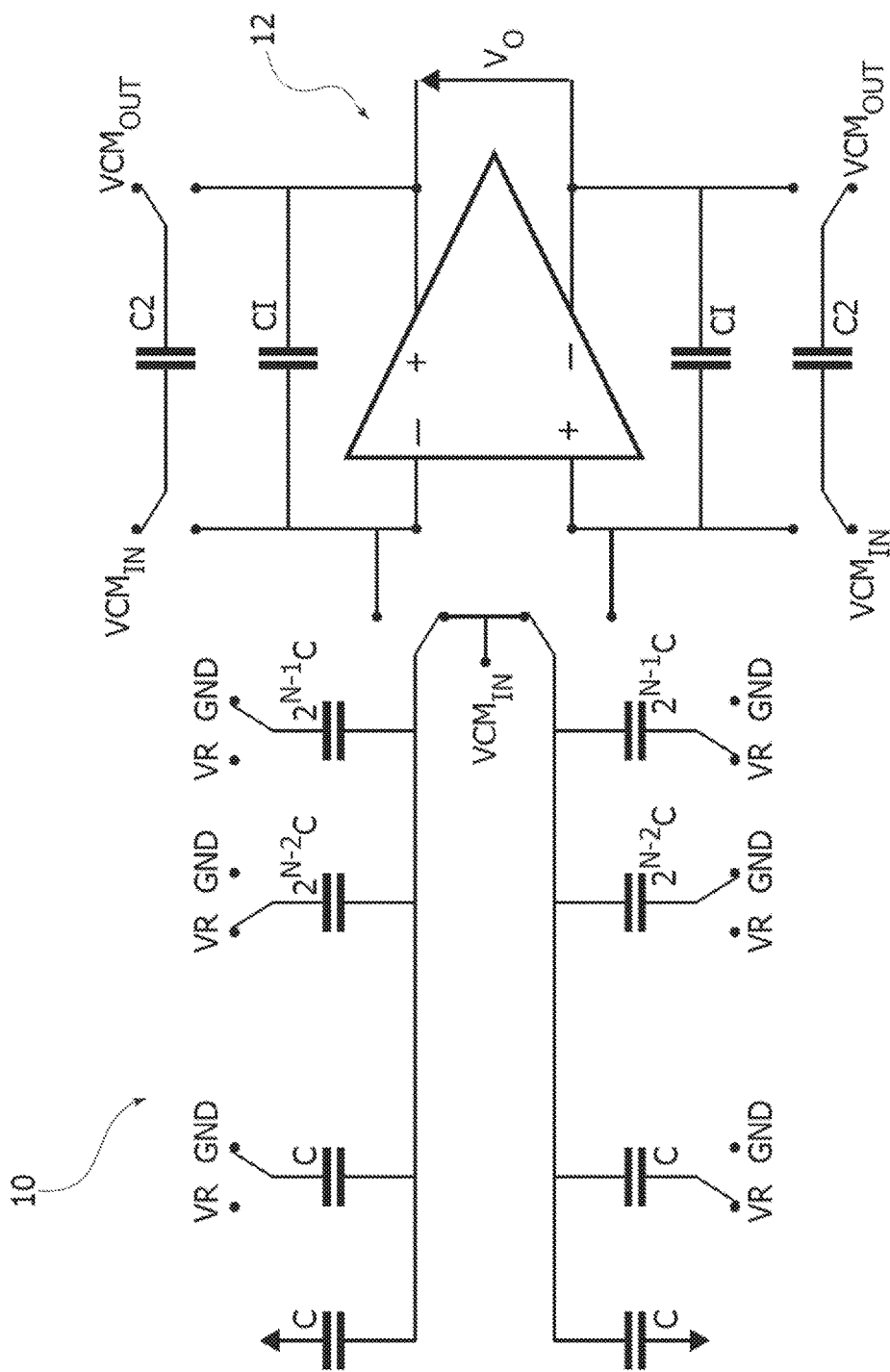
FIGS. 1 to 3 are block diagrams exemplary of conventional digital-to-analog (D/A or DAC) arrangements.
Figure 2:
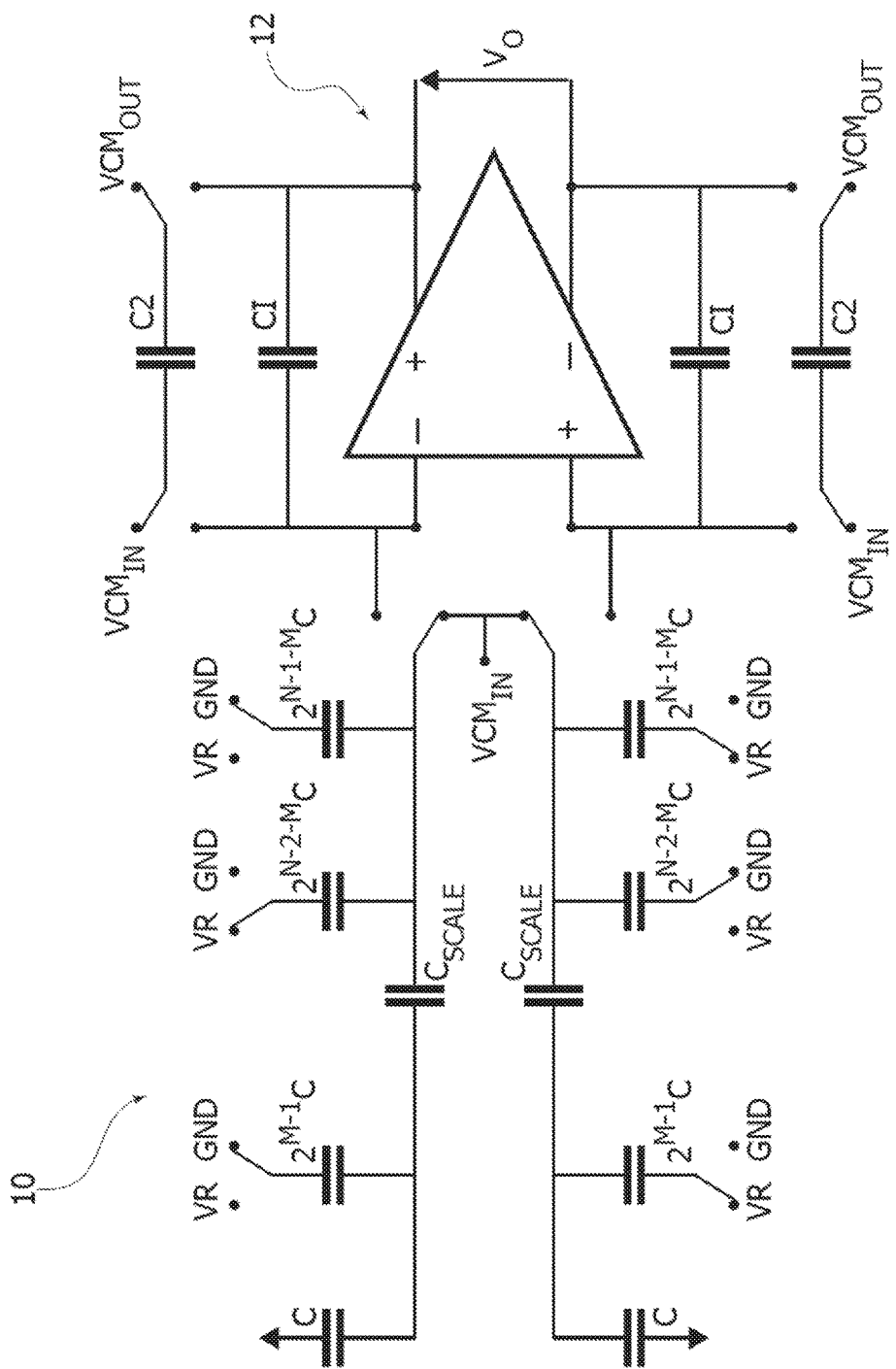
Figure 3:
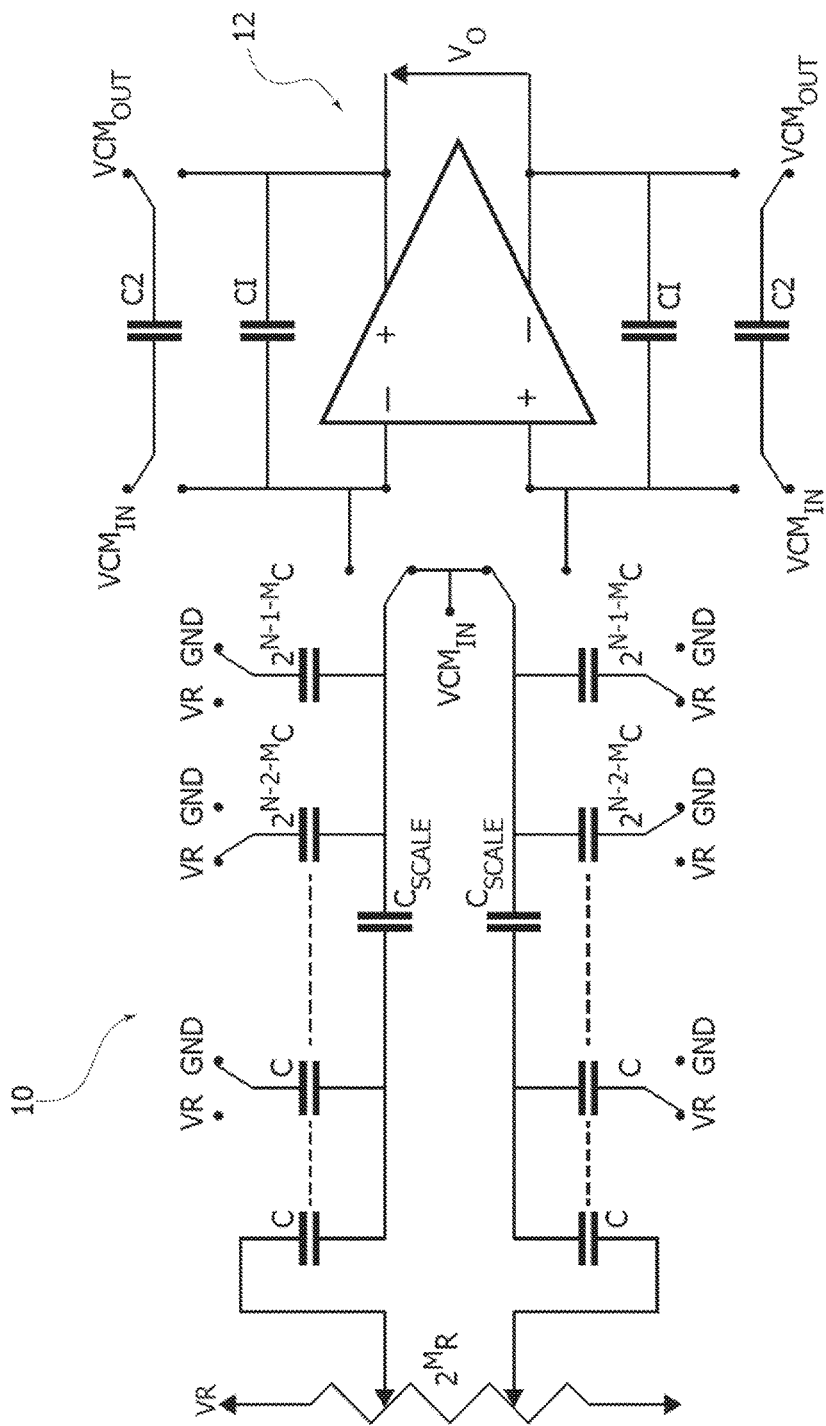

FIGS. 1 to 3 are exemplary of conventional digital-to-analog (D/A or DAC) arrangements.

FIG. 1 is exemplary of an arrangement which can be regarded as including a single capacitive array or "flat" of capacitors C.

FIG. 2 is exemplary of an arrangement including an "upper" capacitor array and a "lower" capacitor array separated by separation capacitors $C_{SCALE}$.

FIG. 3 is exemplary of a converter arrangement including an "upper" capacitive array and a "lower" resistive array.

Throughout FIGS. 1 to 3, N indicates the number of bits (resolution) of the converter and M is the number of bits of the lower array.

Figure 4:
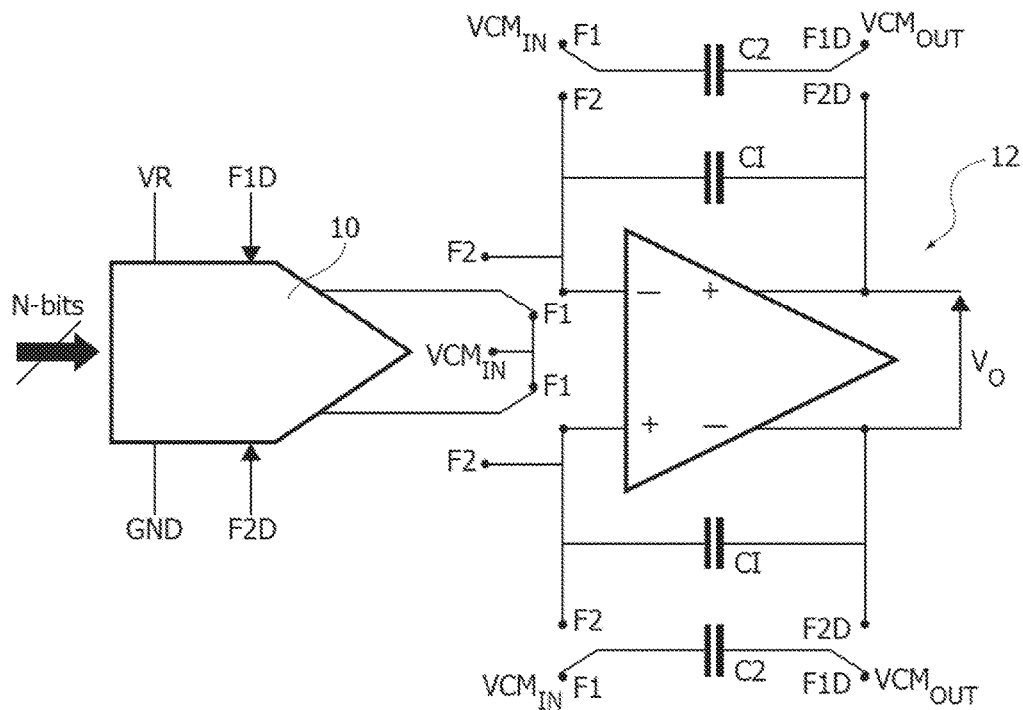
FIG. 4 is exemplary of certain common features of the arrangements of FIGS. 1 to 3, FIG. 5 includes various time diagrams exemplary of possible operation of the circuit layout of FIG. 4.

Irrespective of the specific topology adopted (FIG. 1, FIG. 2 or FIG. 3), such a conventional converter can be seen as corresponding to the schematic representation of FIG. 4, that is with the capacitive (and possibly at least partly resistive—in the case of the solution of FIG. 3) converter 10 coupled with an output amplifier stage 12.

The corresponding DAC transfer function can be expressed (in any of the exemplary cases considered) in the form:

$$V_o = 2(C/C_2) \cdot (b_{N-1} \cdot 2^{N-1} + b_{N-2} \cdot 2^{N-2} + \ldots + b_1 \cdot 2^1 + b_0 \cdot 2^0) \quad V_R \quad (1)$$

where $b_i$ (i=0, ..., N−1) are the bits in the input digital code (to be converted to analog), C is the "unit" capacitor of the converter and C2 is the "switched" capacitor in the amplifier feedback path.

A (first) capacitor CI is provided in the feedback loops of the amplifier 12 to perform a low-pass action on the DAC transfer function. The (second) capacitor C2 is adapted to be selectively coupled in parallel with the capacitor CI to share charge therewith.

Selecting for CI a capacitance value (much) lower than the capacitance value for C2 facilitates avoiding in-band filtering on the converted output signal so that this can be neglected in the transfer function formula.

The bit code sets the initial position, e.g., GND (ground) or VR (namely voltage $V_R$) of the various switches in the DAC array with the system clock adapted to actuate the various switches in the array and in the feedback layout of the amplifier 12.

As indicated previously, capacitors may exhibit an excellent degree of matching, which may directly translate into good linearity in those cases where the converter output is sampled at the end of a transient. This applies both to Integral Non-Linearity (INL) and to Differential Non-Linearity (DNL).

Figure 5:
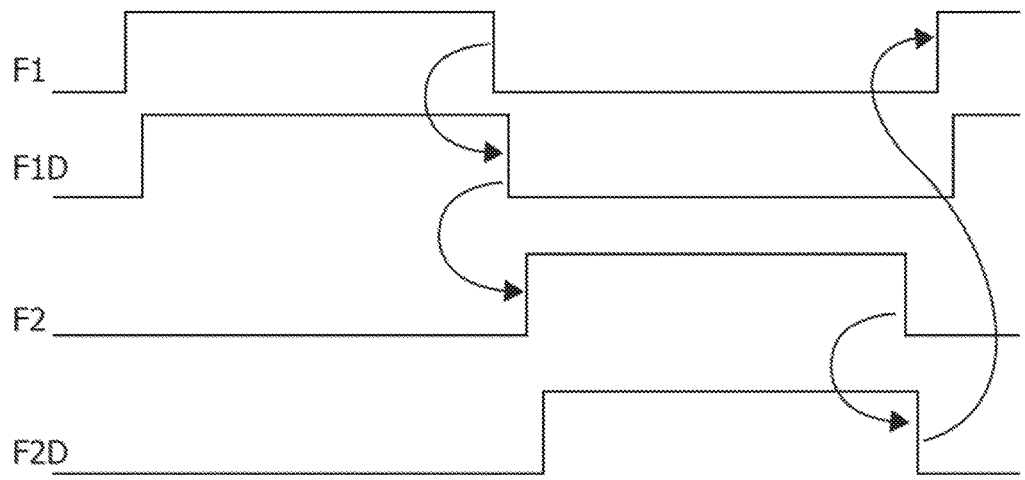

This may be the case when digital-to-analog converters as considered herein are included as components in analog-to-digital converter layouts by adopting e.g., a so-called four phase clock scheme as exemplified in FIG. 5.

The signals illustrated in FIG. 5 may be generated, for example, by a controller (not shown). In FIG. 5, signals F1 and F2 denote respective activation signals for the switches F1 and F2. For example, when signal F1 is high, switches F1 are conductive (i.e., outputs of converter 10 are connected to $VCM_{IN}$, and the left-hand terminal, as illustrated, of capacitors C2 are connected to $VCM_{IN}$). When signal F1 is low, switches F1 are not conductive. When signal F2 is high, switches F2 are conductive (i.e., outputs of converter 10 are connected to inverting and non-inverting ports of amplifier 12, respectively, and to the respective left-hand terminal of capacitors C2). When signal F2 is low, switches F2 are not conductive. When both signals F1 and F2 are low, the output terminals of converter 10 are floating, and the left-hand terminals of capacitors C2 are floating.

Signals F1D and F2D denote respective activation signals for the switches F1D and F2D. For example, when signal F1D is high, switches F1D are conductive (i.e., right-hand terminal, as illustrated, of capacitors C2 are connected to $VCM_{OUT}$). When signal F1D is low, switches F1D are not conductive. When signal F2D is high, switches F2 are conductive (i.e., right-hand terminal of capacitors C2 are connected to respective outputs of amplifier 12). When signal F2D is low, switches F2D are not conductive. When both signals F1D and F2D are low, the right-hand terminals of capacitors C2 are floating.

Signals F1D and F2D represent two delayed versions of signals F1, F2 generated by known circuits (e.g. a controller) along with the clocking signals F1, F2 so that switching at the input side of the amplifier 12 (left-hand side in FIG. 4, with the capacitor C2 de-coupled from the input ground $VCM_{IN}$ of the amplifier 12 and coupled with the first capacitor CI) is followed with a certain delay (see FIG. 5) by the corresponding switching at the output side of the amplifier 12 (right-hand side in FIG. 4, with the capacitor C2 de-coupled from the output ground $VCM_{OUT}$ of the amplifier 12 and coupled with the first capacitor CI).

It will be otherwise appreciated that, as schematically shown in FIG. 4, signals such as F1D and F2D are also supplied to the converter 10. For example, F1D and F2D may be used controlling the sample and hold time of converter 10.

The circuit layout and the associated "four-phase" clocking scheme discussed in the foregoing are otherwise conventional in the art (see e.g., U.S. Pat. No. 6,556,072, which is incorporated herein by reference in its entirety), thus making it unnecessary to provide a more detailed description herein.

It was observed that when transient behavior is taken into account (as in the case of use in digital-to-analog converter) a certain degradation in linearity may result.

Considering the case where the input code $b_o, b_1, \ldots, b_{N-1}$ does not change is helpful in understanding this.

The charge injected by the DAC converter 10 into CI is equal to the one removed by C2 and the voltage on CI at the end of the transient does not change.

However, transient behavior is related to the performance (e.g., in terms of slew rate and bandwidth) of the amplifier 12 and on the balance between injection and removal of charge on CI.

It was observed that, even with a well-designed amplifier, charge removal from C2 may be (much) faster than injection from the DAC array 10. This may be related to charge removal being based on a simple charge sharing process between C2 and CI, while injection from the DAC array 10 involves the amplifier settling time (bandwidth).

For instance, it was observed that when switched on CI, the capacitance C2 (assumed to be completely discharged, that is with no charge) may immediately take most of the charge that was stored on CI in the previous clock period thus producing a (large) voltage drop or spike in the voltage across CI, and in turn in output voltage $V_O$ (for instance a negative spike if $V_O$ was positive and vice-versa if $V_O$ was negative). Then, re-charging of CI by the charge injected from the DAC array 10 follows.

For low-input codes, $V_O$ is low and the amplitude of the spike is also low with the amplifier reacting in a linear way. Conversely, in the presence of high (positive or negative) values for the input code, $V_O$ is large, the amplitude of the spike will be correspondingly large and the amplifier may enter a slewing mode followed by a quasi-linear settling.

This may result in a (highly) non-linear mode of operation.

It was noted that linking (e.g., as a linear function) the energy of the spikes to the output voltage level (e.g., to the input code) may facilitate achieving linearity by taking into count this transient issue. Adopting such an approach may not be feasible for the reasons explained in the foregoing.

Also, an arrangement as exemplified in FIGS. 4 and 5, adopting e.g., a so-called four-phase clocking scheme (F1, F1D, F2, F2D) as exemplified in FIG. 5, may suffer from INL degradation due to a non-linear transient behavior of the arrangement.

Even assuming an ideal absence of mismatches in the components (capacitors, resistors, MOS transistors), in certain applications, non-linearity in the transient behavior may lead to INL values such as +/−0.55 LSB (typical) and +/−1.7 LSB (worst case), where LSB denotes the least significant bit in the input code: of course, these quantitative data are cited here merely by way of example, and are not intended to be construed, even indirectly, as limitative of the embodiments.

Figure 6:
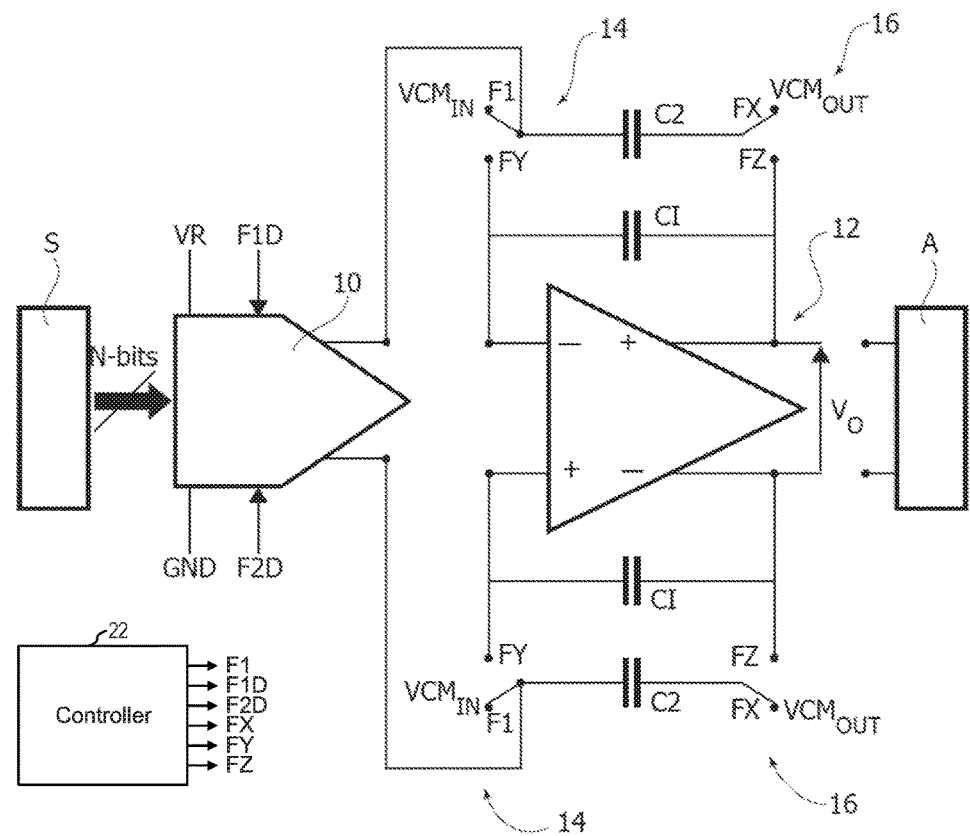
FIG. 6 is a circuit diagram exemplary of embodiments, and FIG. 7 includes various time diagrams exemplary of possible operation of the circuit exemplified in FIG. 6.

One or more embodiments may involve using a circuit layout as schematically represented in FIG. 6 where parts or elements like parts or elements already presented in connection with FIGS. 1 to 5 are indicated by like references. A corresponding description will not be repeated here for brevity.

Figure 7:
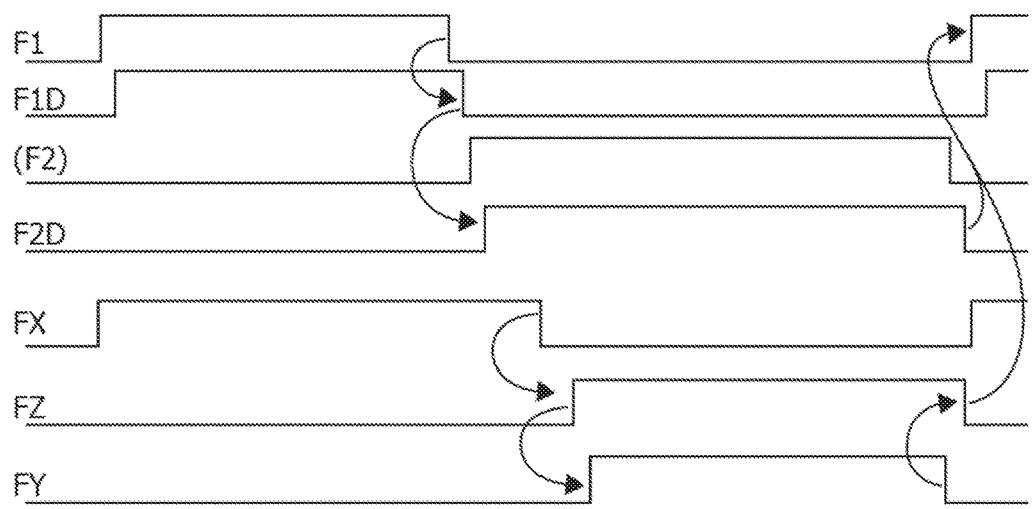

The same also applies to FIG. 7 where the four upper diagrams reproduce the time behavior of the signals F1, F1D, F2, F2D as adapted to be modified according to one or more embodiments.

As is the case with the clocking signals exemplified in FIG. 5, also the various clocking signals exemplified in FIG. 7 can be generated in a manner known per se by clocking circuitry not visible in the figures. In some embodiments, the signals illustrated in FIG. 7 may be generated, for example, by controller 22.

Again it will be assumed that the various switch connections exemplified herein will be "on" (that is, conductive or active) when the respective clocking signal is "high" and "off" (that is, non-conductive or inactive) when the respective clocking signal is "low".

In one or more embodiments the problem due to the charge instantaneously removed from CI by C2 is addressed by charging C2 at a voltage which is a function (e.g., proportional) to the voltage across CI prior to switching C2 on CI.

This approach may facilitate rendering the voltages across C2 and CI related to each other in a linear way, so that charge sharing between C2 and CI is reduced with a lower voltage drop or spike on CI and on $V_O$.

For instance, in one or more embodiments, C2 can be charged by the DAC array 10 for a small amount of time before switching C2 on CI, and then C2 can be connected in parallel to CI, and the DAC array 10 to the corresponding inputs of the amplifier 12.

In one or more embodiments, such a strategy may be implemented by sharing switches in the DAC array 10 and C2 in the (virtual) ground.

As exemplified in FIG. 6, this may involve providing first switches 14 at the input side of the amplifier 12 and second switches 16 at the output side of the amplifier 12.

The first switches 14 have the capability of connecting a common node shared by the output of the DAC array 10 and by one end of the capacitor C2 with either one of: the input (e.g., inverting and non-inverting input ports) of the amplifier 12 and one end of capacitor CI (signal FY in FIG. 7 "on"), and the input reference $VCM_{IN}$ of the amplifier 12 (signal F1 in FIG. 7 "on").

The second switches 16 have the capability of connecting the other end of the capacitor C2 with either one of: the output (e.g., non-inverting and inverting output ports) of the amplifier 12 and the other end of capacitor CI (signal FZ in FIG. 7 "on"), and the output reference $VCM_{OUT}$ of the amplifier 12 (signal FX in FIG. 7 "on").

The associated clocking scheme of the whole arrangement is thus modified as exemplified in FIG. 7.

In FIG. 7, signals F1 and FY denote respective activation signals for the switches F1 and F2. For example, when signal F1 is high, switches F1 are conductive (i.e., outputs of converter 10, together with the left-hand terminal, as illustrated, of capacitors C2 are connected to $VCM_{IN}$). When signal F1 is low, switches F1 are not conductive. When signal FY is high, switches FY are conductive (i.e., outputs of converter 10, together with the left-hand terminal of capacitors C2, are connected to inverting and non-inverting ports of amplifier 12, respectively). When signal FY is low, switches FY are not conductive. When both signals F1 and FY are low, the output terminals of converter 10 are connected to the left-hand terminals of capacitors C2 without being connected to either $VCM_{IN}$ or the inverting and non-inverting ports of amplifier 12.

Signals FX and FZ denote respective activation signals for the switches FX and FZ. For example, when signal FX is high, switches FX are conductive (i.e., right-hand terminal, as illustrated, of capacitors C2 are connected to $VCM_{OUT}$). When signal FX is low, switches FX are not conductive. When signal FZ is high, switches FZ are conductive (i.e., right-hand terminal of capacitors C2 are connected to respective outputs of amplifier 12). When signal FZ is low, switches FZ are not conductive. When both signals FX and FZ are low, the right-hand terminals of capacitors C2 are floating.

By comparing the four upper time diagrams in FIG. 7 with the four diagrams in FIG. 5 one may note that in the signals F1, F1D, F2, F2D the rising edges of F2, F2D (delayed) still follow the falling edges of F1, F1D (delayed) with the falling edges of F2, F2D still anticipating the rising edges of F1, F1D (see the right-hand side of FIG. 7).

Consequently, in one or more embodiments, the same clocking patterns can be maintained for F1, F1D, F2, F2D in so far as the DAC array 10 is concerned.

Also, in so far as the first switches 14 at the input of the amplifier 12 are concerned, the signal F2 is, so-to-say, replaced by the signal FY while switching of the second switches 16 at the output of the amplifier 12 the signals F1D, F2D are replaced by the signals FX, FZ.

As exemplified by the three lower diagrams in FIG. 7 (where all the signals exemplified are assumed to share a common abscissa, that is a common time scale) the following clocking schemes are adopted:

FX: rising edges aligned with the rising edges of F1 and falling edges following the falling edges of F1, F1D as well as the rising edges of F2, F2D, FZ: rising edges following the falling edges of FX and falling edges aligned with the falling edges of F2D, and FY: rising edges following the rising edges of FZ and falling edges aligned with the falling edges of F2.

Direct comparison with conventional layouts as exemplified in FIGS. 4 and 5 demonstrates that (again assuming no mismatches in the components such as capacitors, resistors, moss transistors) an arrangement as exemplified in FIGS. 6 and 7 exhibit INL performance values due to non-linearity in the transient behavior of +/−0.0065 LSB (typical) and +/−0.12 LSB (worst case).

This may correspond to an improvement of a factor of about 84 (roughly two orders of magnitude) and 14 (more than one order of magnitude) in the typical case and in the worst case, respectively, with reference to the (merely exemplary) data reported previously: once again, it will be recalled that the quantitative data cited throughout the instant description are merely exemplary, and are not intended to be construed, even indirectly, as limitative of the embodiments.

The previous description has been provided with reference to a differential layout for the DAC array 10 and the amplifier 12, that is, with the DAC array 10 having a differential output and the amplifier 12 having a differential input and a differential output have been considered as otherwise conventional in the art. Correspondingly, a pair of capacitive feedback loops, including respective capacitors CI, C2 and switches 14, 16, have been presented as exemplary of embodiments. It will be otherwise appreciated that one or more embodiments may in fact apply to non-differential layouts where the DAC array 10 includes a non-differential output and the amplifier 12 includes a non-differential layout including a single capacitive feedback loop (CI, C2, with single switches 14 and 16 in the place of the pairs of switches 14 and 16 discussed previously).

In one or more embodiments, a circuit may include: a capacitive digital-to-analog converter array (that is, a converter including one or more arrays of capacitors—see e.g., 10 throughout the figures) having an input port for receiving a digital input signal (e.g., N-bits) and an output port, an amplifier (e.g., 12) including at least one feedback loop (e.g., CI, C2), the at least one feedback loop including a first capacitor (e.g., CI) coupling the output of the amplifier with the input of the amplifier and a second capacitor (e.g., C2) coupled to the output port of the digital-to-analog converter array at the input of the amplifier, at least one set of switches including a first switch (e.g., 14) and a second switch (e.g., 16) coupled at opposed ends of the second capacitor at the input and at the output of the amplifier, respectively; the first switch and the second switch switchable (see, e.g., signals F1, FY, FZ, FX as exemplified in FIG. 7) to set of different states including, e.g., charging and charge-sharing states, where: in the charging state, the second capacitor is decoupled from the first capacitor with a charging path for the second capacitor provided by the second capacitor being coupled to the output port of the digital-to-analog converter array, and in the charge sharing state, the first switch and the second switch couple the second capacitor (C2) in parallel to the first capacitor to permit charge transfer there between.

In one or more embodiments, the first switch and the second switch may be configured for at least one of:

the first switch coupling the second capacitor to ground (e.g., $VCM_{IN}$) prior to the charging state (see, e.g., F1 "high" while FX is "high" in FIG. 7);

the second switch switching to the charge sharing state before the first switch switches to the charge sharing state (see e.g., the rising edge of FZ preceding the rising edge of FY in FIG. 7);

the second switch switching to the charge sharing state from the charging with a delay (see e.g., the delay between the falling edge of FX and the rising edge of FZ in FIG. 7).

In one or more embodiments, the first switch and the second switch may be configured to be coupled to respective references (e.g., grounds such as $VCM_{IN}$, $VCM_{OUT}$) of the amplifier when not in the charge sharing state (see e.g., F1 and FX "high" in FIG. 7).

In one or more embodiments, the digital-to-analog converter array may include a differential output port, the amplifier may include a differential input and a differential output, the input and the output of the amplifier including non-inverting and inverting nodes, the circuit may include a pair of capacitive feedback loops (e.g., CI, C2), where the first capacitors in the pair of capacitive feedback loops couple a non-inverting/inverting output node of the amplifier with an inverting/non-inverting input node of the amplifier, respectively.

In one or more embodiments, a device may include: a circuit according to one or more embodiments, a digital signal source (e.g., S in FIG. 6) coupled to the input port of the capacitive digital-to-analog converter array in the circuit to apply thereto a digital input signal (e.g., N-bits), and an analog circuit block (e.g., A in FIG. 6) coupled to the output of the amplifier of the circuit to receive therefrom an analog converted signal (e.g., Vo).

In one or more embodiments, the CI capacitance value is (much) lower than the capacitance value for C2, such as about 10 times less or lower. For example, in some embodiments, CI may have a value of 9C, and C2 may have a value of 89C, where C is the unit of capacitance used with reference to FIGS. 1-3 and Equation 1. In some embodiments, C is equal to about 4 fF. Other values for the unit of capacitance C may be used.

A method of operating a circuit according to one or more embodiments may include operating the first switch and the second switch in a cyclical switching sequence, the sequence including (the ordered set of):

i) the first switch and the second switch coupling both ends of the second capacitor to ground (e.g., $VCM_{IN}$, $VCM_{OUT}$—see, e.g., F1 and FX both "high" in FIG. 7);

ii) the first switch decoupling the second capacitor from ground (e.g., $VCM_{IN}$, VCMOUT), with the second capacitor maintained coupled to ground (e.g., $VCM_{IN}$, $VCM_{OUT}$) by the second switch (see e.g., F1 going "low" while FX remains "high" in FIG. 7), thus providing said charging path for the second capacitor in said charging state;

iii) the second switch decoupling the second capacitor from ground (e.g., $VCM_{IN}$, $VCM_{OUT}$—see e.g., FX going "low" after F1 in FIG. 7), iv) the second switch coupling the second capacitor to the first capacitor (see e.g., FZ going "high" after FX has gone "low" in FIG. 7), v) the first switch coupling the second capacitor to the first capacitor, thus providing said charge sharing state (see e.g., FY going "high" after FZ in FIG. 7).

In one or more embodiments, the switching sequence may further include:

vi) the first switch decoupling the second capacitor from the first capacitor (see, e.g., FY going "low" in FIG. 7), vii) the second switch decoupling the second capacitor from the first capacitor (see, e.g., FZ going "low" e.g., after FY in FIG. 7).

At that point the sequence returns to item i) above, with the first switch and the second switch coupling both ends of the second capacitor to ground (see, e.g., F1 and FX both "high", after FY and FZ have gone "low" in FIG. 7).

Without prejudice to the underlying principles, the details and embodiments may vary, even significantly, with respect to what has been described by way of example only, without departing from the extent of protection.

The extent of protection is defined by the annexed claims.

What is claimed is:

1. A circuit comprising:
   a digital signal input node;
   a capacitive digital-to-analog converter array having an input port and an output port, the input port of the capacitive digital-to-analog converter array coupled to the digital input signal node;
   an amplifier comprising a feedback loop, the feedback loop comprising a first capacitor coupled between an output of the amplifier and an input of the amplifier, and a second capacitor coupled to the output port of the capacitive digital-to-analog converter array; and
   a first switch and a second switch coupled at opposed ends of the second capacitor, the first switch and the second switch switchable to a charging state and a charge-sharing state, wherein:
   in the charging state, the second capacitor is decoupled from the first capacitor with a charging path for the second capacitor provided by the second capacitor being coupled to the output port of the capacitive digital-to-analog converter array, and
   in the charge-sharing state, the first switch and the second switch couple the second capacitor in parallel to the first capacitor to permit charge transfer between the first capacitor and the second capacitor.

2. The circuit of claim 1, wherein the first switch and the second switch are configured for:
   the first switch coupling the second capacitor to ground prior to the charging state;
   the second switch switching to the charge-sharing state before the first switch switches to the charge-sharing state; or
   the second switch switching to the charge-sharing state from the charging state with a delay.

3. The circuit of claim 1, wherein the first switch and the second switch are configured to be coupled to respective grounds of the amplifier when not in the charge-sharing state.

4. The circuit of claim 1, wherein
   the capacitive digital-to-analog converter array comprises a differential output port;

the amplifier comprises a differential input having an inverting node and a non-inverting node, and a differential output having an inverting node and a non-inverting node;
the first capacitor is coupled between the non-inverting node of the differential output of the amplifier and the inverting node of the differential input of the amplifier;
the second capacitor is coupled to a first output port of the differential output port of the capacitive digital-to-analog converter array; and
the feedback loop further comprises a third capacitor coupled between the inverting node of the differential output of the amplifier and the non-inverting node of the differential input of the amplifier, and a fourth capacitor coupled to a second output port of the differential output port of the capacitive digital-to-analog converter array.

5. The circuit of claim 1, wherein the capacitive digital-to-analog converter array comprises a resistor.

6. The circuit of claim 1, further comprising:
a digital signal source having an output coupled to the digital signal input node; and
an analog circuit block coupled to the output of the amplifier.

7. A device comprising:
a capacitive digital-to-analog converter array having an input node and an output node;
an amplifier having an input node and an output node;
a first capacitor coupled between the input node of the amplifier and the output node of the amplifier;
a second capacitor having a first terminal directly connected to the output of the capacitive digital-to-analog converter array;
a first switch coupled between the first terminal of the second capacitor and a first voltage node;
a second switch coupled between the first terminal of the second capacitor and the input node of the amplifier;
a third switch coupled between a second terminal of the second capacitor and a second voltage node; and
a fourth switch coupled between the second terminal of the second capacitor and the output node of the amplifier.

8. The device of claim 7, wherein the first voltage node is a ground node.

9. The device of claim 7, wherein the second voltage node is a ground node.

10. The device of claim 7, further comprising a controller configured to:
turn on the first switch;
turn on the third switch;
after turning on the first switch and the third switch, turn off the first switch;
after turning off the first switch, turn off the third switch;
after turning off the third switch, turn on the fourth switch; and
after turning on the first switch, turn on the second switch.

11. The device of claim 10, wherein the controller is further configured to:
after turning on the second switch, turn off the second switch; and
after turning off the second switch, turn off the fourth switch.

12. The device of claim 11, wherein the controller is configured to turn the fourth switch off at the same time as the controller turns on the first and third switches.

13. The device of claim 10, wherein the controller is further configured to generate a first signal to control a sample and hold time of the capacitive digital-to-analog converter array, and wherein the first signal is a delayed version of a signal controlling the first switch.

14. The device of claim 7, wherein the amplifier comprises a differential amplifier.

15. The device of claim 7, further comprising:
a digital signal source coupled to the input node of the capacitive digital-to-analog converter array; and
analog circuit coupled to the output node of the amplifier.

16. A method of operating a first switch and a second switch in a cyclical switching sequence, wherein the first switch and the second switch are coupled at opposed ends of a second capacitor of an amplifier, the amplifier comprising a first capacitor coupled between an output of the amplifier and an input of the amplifier, the second capacitor coupled to an output port of a digital-to-analog converter array, the digital-to-analog converter array having an input port, the cyclical switching sequence comprising:
connecting a first terminal of the second capacitor to a first reference voltage node via the first switch and a second terminal of the second capacitor to a second reference voltage node via the second switch;
after connecting the first terminal of the second capacitor to the first reference voltage node and the second terminal of the second capacitor to the second reference voltage node, disconnecting the first terminal of the second capacitor from the first reference voltage node while keeping the second terminal of the second capacitor connected to the second reference voltage node;
after disconnecting the first terminal of the second capacitor from the first reference voltage node, disconnecting the second terminal of the second capacitor from the second reference voltage node;
after disconnecting the second terminal of the second capacitor from the second reference voltage node, connecting the second terminal of the second capacitor to a first terminal of the first capacitor; and
after connecting the second terminal of the second capacitor to the first terminal of the first capacitor, connecting the first terminal of the second capacitor to a second terminal of the first capacitor.

17. The method of claim 16, wherein the cyclical switching sequence further comprises:
after connecting the first terminal of the second capacitor to the second terminal of the first capacitor, disconnecting the first terminal of the second capacitor from the second terminal of the first capacitor; and
after disconnecting the first terminal of the second capacitor from the second terminal of the first capacitor, disconnecting the second terminal of the second capacitor from the first terminal of the first capacitor.

18. The method of claim 16, wherein:
connecting the first terminal of the second capacitor to the first reference voltage node comprises transitioning a first signal to a first state;
connecting the second terminal of the second capacitor to the second reference voltage node comprises transitioning a second signal to the first state;
disconnecting the first terminal of the second capacitor from the first reference voltage node comprises transitioning the first signal to a second state;
disconnecting the second terminal of the second capacitor from the second reference voltage node comprises transitioning the second signal to the second state;

connecting the second terminal of the second capacitor to the first terminal of the first capacitor comprises transitioning a third signal to the first state; and connecting the first terminal of the second capacitor to the second terminal of the first capacitor comprises transitioning a fourth signal to the first state.

19. The method of claim 18, wherein the cyclical switching sequence further comprises:

generating a fifth signal as a delayed version of the first signal; and providing the fifth signal to the digital-to-analog converter array.

20. The method of claim 16, wherein the first reference voltage node is connected to ground and the second reference voltage node is connected to ground.

* * * * *